(12) United States Patent
Sakaguchi

(10) Patent No.: US 11,108,015 B2
(45) Date of Patent: Aug. 31, 2021

(54) ORGANIC ELECTROLUMINESCENT ILLUMINATION PANEL, MANUFACTURING METHOD THEREOF, AND ORGANIC ELECTROLUMINESCENT ILLUMINATION DEVICE WITH SPACERS PROTRUDING FROM A SECOND ELECTRODE

(71) Applicant: NEC Lighting, Ltd., Tokyo (JP)

(72) Inventor: Yoshikazu Sakaguchi, Tokyo (JP)

(73) Assignee: HotaluX, Ltd., Tokyo (JP)

( * ) Notice: Subject to any disclaimer, the term of this patent is extended or adjusted under 35 U.S.C. 154(b) by 60 days.

(21) Appl. No.: 16/286,286

(22) Filed: Feb. 26, 2019

(65) Prior Publication Data
US 2019/0198798 A1 Jun. 27, 2019

Related U.S. Application Data

(63) Continuation of application No. 14/389,500, filed as application No. PCT/JP2013/058273 on Mar. 22, 2013, now Pat. No. 10,270,058.

(30) Foreign Application Priority Data

Mar. 30, 2012 (JP) ................................. 2012-079905

(51) Int. Cl.
*H01L 51/52* (2006.01)
*H05B 33/04* (2006.01)
(Continued)

(52) U.S. Cl.
CPC .......... *H01L 51/525* (2013.01); *H05B 33/04* (2013.01); *H05B 33/10* (2013.01); *H05B 33/26* (2013.01);
(Continued)

(58) Field of Classification Search
CPC .................................................... H01L 51/525
See application file for complete search history.

(56) References Cited

U.S. PATENT DOCUMENTS 6,952,078 B1 * 10/2005 Guenther .............. H01L 51/525
313/506
2002/0030443 A1 3/2002 Konuma et al.
(Continued)

FOREIGN PATENT DOCUMENTS

JP 2002-151252 A 5/2002
JP 2005-166445 A 6/2005
(Continued)

OTHER PUBLICATIONS

International Search Report, dated Jun. 25, 2013, from corresponding PCT application No. PCT/JP2013/058273.
(Continued)

*Primary Examiner* — Thao X Le
*Assistant Examiner* — Geoffrey H Ida
(74) *Attorney, Agent, or Firm* — Sughrue Mion, PLLC

(57) ABSTRACT

Provided is a long-life organic electroluminescent illumination panel which is flexible and, even when a load is applied by bending, impact or vibration, can suppress the occurrence of defects in an electrode layer and an organic layer containing an organic electroluminescent material, and which can suppress the occurrence of dark spots due to short circuiting. This organic electroluminescent illumination panel includes: a pair of electrode layers, at least one of which is transparent, between a flexible film substrate and a flexible film sealing material, at least one of which is transparent; and an organic layer containing an organic electroluminescent material which is sandwiched between the pair of electrode layers. This organic electroluminescent illumination panel has multiple spacers which are disposed on an electrode layer laminated on the flexible film substrate
(Continued)

so as to pass through the organic layer and another electrode layer.

19 Claims, 3 Drawing Sheets

(51) Int. Cl.
    *H05B 33/10*     (2006.01)
    *H05B 33/26*     (2006.01)
    *H01L 51/00*     (2006.01)
    *H01L 51/56*     (2006.01)

(52) U.S. Cl.
    CPC .......... *H01L 51/0097* (2013.01); *H01L 51/56* (2013.01); *H01L 2251/5338* (2013.01); *H01L 2251/5361* (2013.01)

(56) References Cited

U.S. PATENT DOCUMENTS

| | | |
|---|---|---|
| 2002/0195929 A1 | 12/2002 | Haase et al. |
| 2003/0062518 A1 | 4/2003 | Auch et al. |
| 2003/0194484 A1* | 10/2003 | Yamazaki ............... C23C 14/24 427/66 |
| 2005/0161740 A1* | 7/2005 | Park .................... H01L 27/3253 257/347 |
| 2007/0048902 A1* | 3/2007 | Hiatt .................... H01L 21/6836 438/108 |
| 2007/0128765 A1 | 6/2007 | Auch et al. |
| 2008/0297042 A1* | 12/2008 | Ahn ..................... H01L 27/3251 313/504 |
| 2010/0044733 A1* | 2/2010 | Okabe ................. H01L 27/3246 257/98 |
| 2011/0233540 A1 | 9/2011 | Yamazaki |
| 2013/0016308 A1 | 1/2013 | Urayama et al. |

FOREIGN PATENT DOCUMENTS

| | | |
|---|---|---|
| JP | 2006-252988 A | 9/2006 |
| JP | 2007-073504 A | 3/2007 |
| JP | 2007-335327 A | 12/2007 |
| JP | 2009-110785 A | 5/2009 |
| JP | 2010-086814 A | 4/2010 |
| JP | 2011-154797 A | 8/2011 |

OTHER PUBLICATIONS

Japanese Communication, dated Jun. 2, 2020, issued in related Japanese Application No. 2019-095903, 8 pages in English and Japanese.

* cited by examiner though the organic EL illumination panel is bent, as shown in FIG. 8, the organic layer (13) having a highly thin thickness of nm order or the electrode layer (14) may be damaged due to contact and compression with the sealing material (15).

ORGANIC ELECTROLUMINESCENT ILLUMINATION PANEL, MANUFACTURING METHOD THEREOF, AND ORGANIC ELECTROLUMINESCENT ILLUMINATION DEVICE WITH SPACERS PROTRUDING FROM A SECOND ELECTRODE

TECHNICAL FIELD

The present invention relates to an organic electroluminescent illumination panel, a method for manufacturing the same, and an organic electroluminescent illumination device.

BACKGROUND

An organic EL illumination panel using light emission from organic electroluminescence (organic EL) is formed by laminating a transparent electrode layer, an organic EL layer and an electrode layer sequentially onto a transparent substrate and sealing them with a sealing material. Since a substrate used in such an organic EL illumination panel is required to have stiffness and transparency ensuring high transmission to light emitting from organic EL, glass substrates have been used. However, such glass substrates are brittle, is not easy to handle, and is difficult to make a glass substrate having a thickness such as a thin film. As such an organic EL illumination panel requires miniaturization, slimming, light weight and flexibility, transparent and flexible resin film attracts attention as an alternative to glass substrate since they are capable of winding as a roll, is easy to handle, is able to manufacture organic EL efficiently, has an improved design properties, and is inexpensive.

As shown in FIG. 7, an organic EL illumination panel has a structure that a transparent electrode layer (12), an organic layer (13) and an electrode layer (14) are sequentially laminated onto a transparent substrate (11) followed by fixing a sealing material (15) to the transparent substrate (11) via an adhesive (17) of a seal part (16), and a total thickness is about several mm. To obtain a flexible organic EL illumination panel, a transparent and flexible resin film is used for the transparent substrate (11) and also a material having the same flexibility as the substrate is used for the sealing material (15), so that bending property and ductility are consistent between the substrate and the sealing material. However, when the organic EL illumination panel is bent, as shown in FIG. 8, the organic layer (13) having a highly thin thickness of nm order or the electrode layer (14) may be damaged due to contact and compression with the sealing material (15).

As an example of organic EL elements, it has been reported an organic EL element that spacer layers are provided in regions having no electrode layer on a substrate to fill gaps, and an organic material layer is provided thereon, thereby suppressing the permeation of air into the gaps, the deterioration of the organic EL element due to moisture present in air, and the diminishment of luminous brightness due to damage caused by bending of the organic material layer (Patent document 1), or an organic EL element panel that a sealing material having no spacer is used in regions with multi-level crossing of wirings so as to suppress electrical contact between an upper wiring and a lower wiring even if spacers are inserted under excess sealing pressure (Patent document 2).

Besides, it has been reported an organic EL element comprising a pixel electrode, a counter electrode, an organic light-emitting layer therebetween, a mask spacer on a partition wall surrounding the pixel electrode and an inorganic film on the partition wall so as to suppress to stick material of an auxiliary counter electrode to the mask spacer and peel when forming the auxiliary counter electrode by vapor deposition and an organic EL device using the organic EL element which is able to suppress to occur defects of emission (Patent documents 3 and 4).

In the field of such organic EL illumination panels, there is a need for an organic EL illumination panel which is sealed between a substrate and a sealing material made of a flexible substrate and be able to suppress the occurrence of defects in an organic layer containing organic EL or an electrode layer even when bending force is applied to an organic EL illumination panel.

PRIOR ART DOCUMENTS

Patent Documents

Patent document 1: JP-A 2005-166445
Patent document 2: JP-A 2009-110785
Patent document 3: JP-A 2007-73504
Patent document 4: JP-A 2011-154797

SUMMARY OF THE INVENTION

Problems to be Solved by the Invention

It is an object of the present invention to provide a long-life organic EL illumination panel which is flexible and, even when a load is applied by bending, impact and vibration, can suppress the occurrence of defects in an organic layer containing organic EL or an electrode layer, and which can suppress the occurrence of dark spots due to short circuiting; an organic EL illumination device using the same; and a method for manufacturing the same.

Means to Solve the Problems

The present invention relates to an organic EL illumination panel comprising a pair of electrode layers, at least one of which is transparent, between a flexible film substrate and a flexible film sealing material, at least one of which is transparent; and an organic layer containing organic electroluminescence which is sandwiched between said pair of electrode layers, wherein multiple spacers are disposed on an electrode layer laminated on the flexible film substrate so as to pass through the organic layer and another electrode layer.

Further, the present invention relates to an organic EL illumination panel comprising a pair of electrode layers, at least one of which is transparent, between a flexible film substrate and a flexible film sealing material, at least one of which is transparent; and an organic layer containing organic electroluminescence which is sandwiched between said pair of electrode layers, wherein multiple spacers are disposed on the flexible film sealing material so as to be opposed to an electrode layer laminated on the organic layer and above the organic layer.

Further, the present invention relates to an organic electroluminescent illumination device characterized by using the organic electroluminescent illumination panel.

Further, the present invention relates to a method for manufacturing an organic electroluminescent illumination panel comprising a pair of electrode layers, at least one of which is transparent, between a flexible film substrate and a flexible film sealing material, at least one of which is transparent; and an organic layer containing organic electroluminescence which is sandwiched between said pair of electrode layers, wherein the method comprises laminating a photoresist film on an electrode layer laminated on the flexible film substrate and patterning the photoresist film by photolithography to form spacers so as to pass through the organic layer and another electrode layer, or printing a spacer material on an electrode layer laminated on the flexible film substrate by dispense coating, inkjet coating, or screen-flexo-gravure to form spacers so as to pass through the organic layer and another electrode layer.

Further, the present invention relates to a method for manufacturing an organic electroluminescent illumination panel comprising a pair of electrode layers, at least one of which is transparent, between a flexible film substrate and a flexible film sealing material, at least one of which is transparent; and an organic layer containing organic electroluminescence which is sandwiched between said pair of electrode layers, wherein the method comprises laminating a photoresist film on the flexible film sealing material and patterning the photoresist film by photolithography to form spacers being opposed to an electrode layer laminated on the organic layer and above the organic layer, or printing a spacer material on the flexible film sealing material by dispense coating, inkjet coating, or screen-flexo-gravure to form spacers being opposed to an electrode layer laminated on the organic layer and above the organic layer.

Effects of the Invention

An organic EL illumination panel of the present invention is flexible and, even when a load is applied by bending, impact and vibration, can suppress the occurrence of defects in an organic layer containing organic EL or an electrode layer, and can suppress the occurrence of dark spots due to short circuiting, and has long-life.

DETAILED DESCRIPTION OF THE INVENTION

Figure 1:
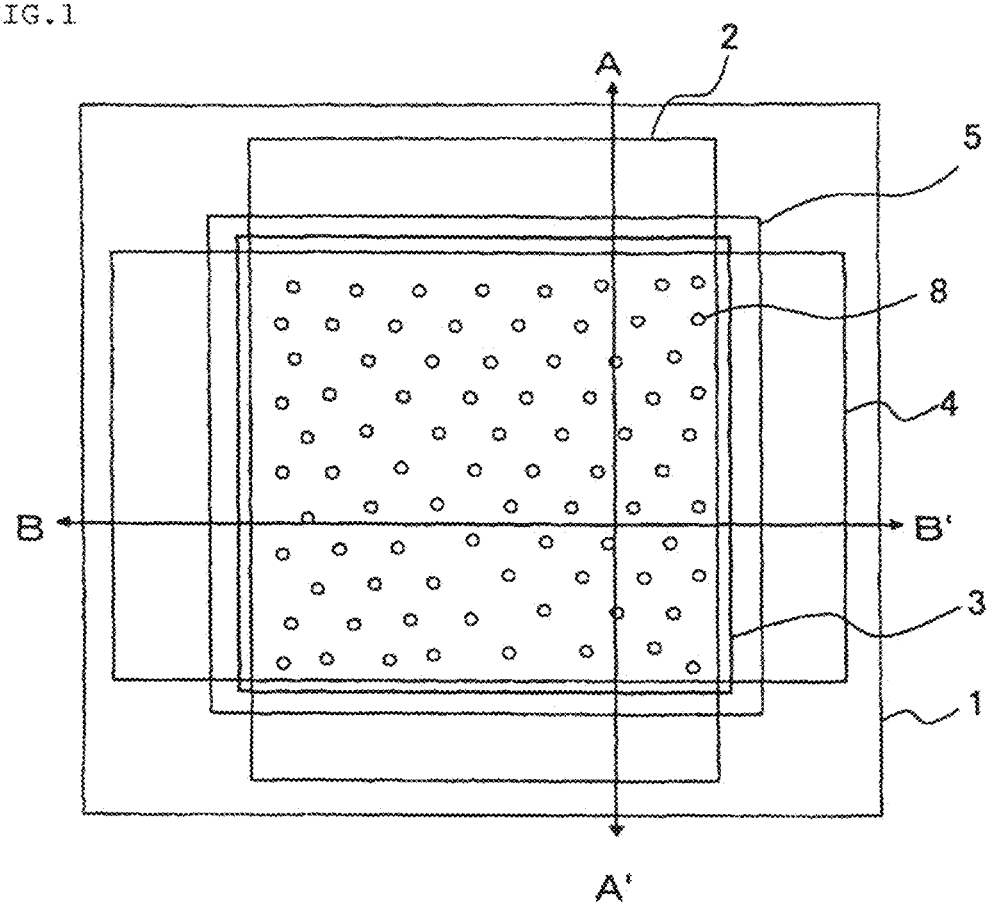
FIG. 1 is a schematic view showing an example of an organic EL illumination panel according to the present invention.

The organic electroluminescent illumination panel according to the present invention comprises a pair of electrode layers, at least one of which is transparent, between a flexible film substrate and a flexible film sealing material, at least one of which is transparent; and an organic layer containing organic electroluminescence which is sandwiched between said pair of electrode layers, wherein the organic electroluminescent illumination panel has multiple spacers which are disposed on an electrode layers laminated on the flexible film substrate so as to pass through the organic layer and another electrode layer.

At least one of the flexible film substrate and the flexible film sealing material (they are also referred to as flexible films) used in the organic electroluminescent illumination panel should has transparency, and the other may or may not be transparent. Specifically, a transparent flexible film substrate and a non-transparent flexible film sealing material may be used.

The transparency of the flexible film substrate or the flexible film sealing material should be able to transmit light emitting from the organic EL contained in the organic layer such that the organic EL illumination panel can be operated, a high transmission rate being preferred. For example, a transmission rate to light emitting from the organic EL is preferably 80% or more transmission based on a total light amount, and more preferably 84% or more. The flexible film substrate and the flexible film sealing material do not necessarily need to use the same material, but it is preferred to use materials having similar bending stress. Specifically, preferred flexible films may include polyesters such as polyethylene naphthalate (PEN), polyethylene terephthalate (PET) or the like; acrylic resins such as polymethyl methacrylate, polyethyl methacrylate, polymethyl acrylate, polyethyl acrylate or the like; polyethersulfone (PES), polycarbonate (PC); or the like. For example, the flexible film substrate may have a thickness of 20-300 µm, and the flexible film sealing material may have a thickness of 50-200 µm.

These flexible films may have a gas barrier layer to suppress the permeation of gases such as water. Preferably, such a gas barrier layer may be an inorganic layer comprising silicone nitride, silicone nitride oxide, silicone oxide or the like, or may be a transparent layer comprising a hydrophobic resin layer such as olefin resins or a hydrophilic resin layer such as acrylic resins along with the inorganic layer.

One of the pair of electrode layers is provided on the flexible film substrate. If the flexible film substrate is transparent, then a transparent electrode layer is formed. The transparent electrode layer transmits light emitting from the organic EL contained in the organic layer, so that the organic EL illumination panel is operated. Preferably, the transparent electrode layer has a high transmission rate to light emitting from the organic EL. For example, a transmission rate to light emitting from the organic EL is preferably 89% or more transmission based on a total light amount. The transparent electrode layer may supply either carriers of holes or electrons, but may be formed from a light-transmitting material such as indium tin oxide, indium zinc oxide or the like to make a positive electrode for supplying holes. For example, the transparent electrode layer may have a thickness of 100-300 nm.

The electrode layer mated with the transparent electrode layer is not limited in light transmission. When the transparent electrode layer is a positive electrode formed from the foregoing light-transmitting electrode materials, the electrode layer may be a light-shielding negative electrode for supplying electrons. Specifically, the electrode layer may be a light-shielding negative electrode formed as a thin film of a metal, for example aluminum, silver or the like. The electrode layer may reflect light emitting from the organic layer toward the light-transmitting electrode layer, and suppress a reduction in amount of light emitting from a light-emitting surface of the organic EL illumination panel. The electrode layer is preferably thick in terms of voltage drop due to wiring resistance, and may be 50-300 nm, for example. Also, the electrode layer may be transparent by using a light-transmitting negative electrode material. If both of the flexible film substrate and the flexible film sealing material are transparent, a transparent organic EL illumination panel may be formed. To connect the electrode layer and a wiring member, one end of the electrode layer may be preferably extended to form a connection part.

Multiple spacers are provided on the electrode layer on the flexible film substrate. Preferably, the spacers may have a cylindrical shape such as a circular columnar or a hexagonal columnar, a spherical shape, or the like. When spacers having a linear shape or a large contact area are provided, they are prone to impart stiffness to the organic EL illumination panel therefore it is difficult to maintain the panel's flexibility. To the contrary, since columnar or spherical spacers have low contact areas with flexible films, the organic EL illumination panel can maintain its flexibility. With respect to a cross-sectional area occupied by one spacer in a cross-section parallel to a surface direction of the organic layer, the occupied cross-sectional area is desirable to be large in terms of the function of spacers for suppressing contact between the flexible film substrate and the flexible film sealing material, while the occupied cross-sectional area is desirable to be small in terms of avoiding perceiving spacers without organic EL in the organic layer as portions without emitting light visually. Thus, it is preferred to select the cross-sectional area considering the aforementioned issue. An cross-sectional area occupied by one spacer in a cross-section parallel to a surface direction of the organic layer preferably corresponds to an area of a circle having a diameter of 5 µm to 50 µm inclusive, and more preferably an area of a circle having a diameter of 8 µm to 20 µm inclusive. If the average cross-sectional area corresponds to an area of a circle having a diameter of 5 µm or more, spacers may be more stably formed by photolithography. If the average cross-sectional area corresponds to an area of a circle having a diameter of 50 µm or less, spacers may not be visually perceived and a high aperture ratio, i.e., a large light-emitting area of the organic layer may be obtained.

To maintain contactless between the flexible film substrate and the flexible film sealing material and enlarge a light-emitting area of the organic layer, the density of multiple spacers provided is preferably from 100 spacers/cm$^2$ to 400 spacers/cm$^2$ inclusive in the organic layer, and more preferably from 100 spacers/cm$^2$ to 200 spacers/cm$^2$ inclusive. If the density of spacers is within said ranges, intervals between flexible films can be maintained and defects in the organic layer or the electrode layers can be suppressed even when the organic EL illumination panel is bent.

The spacers have a height to pass through the organic layer and another electrode layer with distal ends being protruded from the other electrode layer. Specifically, the distal ends preferably protrude average 0.2 µm to 100 µm inclusive from a top surface of the other electrode layer, and more preferably average 1 µm to 30 µm inclusive.

The spacers may be made from resin materials or inorganic compounds as long as it is a non-conductive material not to cause short-circuiting between the electrode layers. Specifically, the spacers may be made from the same materials as flexible films, or resists used in photolithography of the electrode layers. In particular, materials are preferred, which have strength to maintain intervals between flexible films when the organic EL illumination panel is bent. Also, it is preferred to select a spacer material considering density, production effectiveness and the like.

For example, the organic layer may have a structure that a hole injection layer, a hole transporting layer, a light-emitting layer containing organic EL, an electron transporting layer and an electron injection layer are sequentially laminated. A plurality of carrier blocking layers may be provided to suppress the migration of holes or electrons without emitting light from the light-emitting layer and enhance light-emitting effectiveness.

The hole injection layer is provided to reduce a height of an injection barrier to holes injected from the transparent electrode layer to the organic layer, alleviate a difference in energy level between the positive electrode and the hole transporting layer, and facilitate the injection of holes injected from the positive electrode to the hole transporting layer. As materials for the hole injection layer from which the hole injection layer is formed, examples may include copper phthalocyanine or arylamine derivatives such as starburst-type aromatic amines, or these materials having doped an inorganic substance such as vanadium pentoxide or molybdenum trioxide or an organic substance such as F4-TCNQ to reduce the injection barrier and lower driving voltage.

The hole transporting layer is provided to increase the migration rate of holes to the light-emitting layer. As materials for the hole transporting layer from which the hole transporting layer is formed, those having suitable ionization potential and electron affinity to prevent electrons from being leaked from the light-emitting layer are preferred. Examples of materials for the hole transporting layer used may include triphenyldiamines such as bis(di(p-tolyeamino-phenyl)-1,1-cyclohexane, TPD, N,N'-diphenyl-N—N-bis(1-naphthyl)-1,1'-biphenyl)-4,4'-diamine (α-NPD) or the like, or starburst-type aromatic amines.

The light-emitting layer is used to recouple holes to electrons injected from the electrodes and emit fluorescence and/or phosphorescence. As materials from which the light-emitting layer is formed, examples may include low molecular weight compounds such as tris(8-quinolinol)aluminum complex (Alq3), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl)perylene tetracarboxylic diimide (BPPC), 1,4-bis(N-p-tolyl-N-4-(4-methylstyryl) phenylamino)naphthalene or the like, or high molecular weight compounds such as polyphenylenevinyl-based polymers or the like.

As other light-emitting materials, materials which comprise binary components of a host and a dopant, and emit light from a dopant molecule by transferring excitation energy generated by a host molecule to the dopant molecule may be used. As such binary light-emitting materials, the foregoing light-emitting materials, electron transporting materials or hole transporting materials may be used. For example, those in which a host quinolinol metal complex such as Alq3 is doped with 4-dicyanomethylene-2-methyl-6-(p-dimethylaminostyryl)-4H-pyrano(DCM), a quinacridone derivative such as 2,3-quinacridone, or a coumarin derivative such as 3-(2'-benzothiazole)-7-diethylamino coumarin as a dopant; a host electron transporting material bis(2-methyl-8-hydroxyquinoline)-4-phenylphenol-aluminum complex is doped with a condensed polycyclic aromatic compound such as perylene as a dopant; a host hole transporting material 4,4'-bis(m-tolylphenylamino)biphenyl (TPD) is doped with rubrene as a dopant; or a host carbazol compound such as 4,4'-biscarbazolylbiphenyl (CBP) or 4,4'-bis(9-carbazolyl)-2,2'-dimethylbiphenyl (CDBP) is doped with a platinum complex or an iridium complex such as tris-(2-phenylpyridine)iridium complex (Ir(ppy)3), (bis(4,6-di-fluorophenyl)-pyridinate-N,C2')picolinate iridium complex (FIr(pic)), (bis(2-(2'-benzo(4,5-α)thienyl)pyridinate-N, C2')(acetylacetonate)iridium complex (Bt2Ir(acac)), Ir(pic)3 or Bt2Ir(acac) as a dopant.

These light-emitting materials may be selected depending on a light-emitting color intended for an organic EL illumination device. Specifically, for green color, Alq3 and a dopant such as quinacridone, coumarin, Ir(ppy)3 or the like may used; for blue color, DPVBi and a dopant such as perylene, distyrylarylene derivatives, FIr(pic) or the like may be used; for green-bluegreen color, OXD-7 or the like may be used; for red-orange color, a dopant such as DCM, DCJTB, Ir(pic)3 or the like may be used; for yellow color, a dopant such as rubrene, Bt2Ir(acac) or the like may be used. Also, to obtain white color light, a combination of host Alq3 and guest DCM (orange color) may be used as light-emitting materials.

As the light-emitting layer for white color light, there may be a three-layer lamination structure in which each layer contains a light-emitting material emitting red, green and blue color, respectively; or a two-layer lamination structure in which each layer contains a light-emitting material emitting blue and yellow, respectively, as complementary colors; or a single-layer structure comprising mixed light-emitting materials formed by co-depositing these light-emitting materials for each color. Further, a light-emitting layer may be formed by arranging the light-emitting material corresponding to each color layer in the three-layer or two-layer lamination structure as fine pixels of red, blue, green and the like in a plane.

As the carrier blocking layer, the hole blocking layer may be provided on the light-emitting layer. The hole blocking layer is provided to block holes passing through the light-emitting layer without emitting light and enhance recoupling holes to electrons in the light-emitting layer. As materials from which the hole blocking layer is formed, 2,9-dimethyl-4,7-diphenyl-1,10-phenanthroline (BCP), triphenyldiamine derivatives, triazole derivatives or the like may be used.

The electron transporting layer is provided to increase the migration rate of electrons to the light-emitting layer. The electron transporting layer is preferably formed from materials having suitable ionization potential and electron affinity to prevent holes from being leaked from the light-emitting layer. Examples of materials for the electron transporting layer used may include organic substance, for example oxadiazole derivatives such as 2-(4-biphenylyl)-5-(4-t-butylphenyl)-1,3,4-oxadiazole (Bu-PBD) or OXD-7, triazole derivatives, quinolinol-based metal complexes or the like, or the foregoing organic materials having doped electron donor materials including alkali metals such as lithium.

The electron injection layer is provided to facilitate the injection of electrons from the electrode layer to electron transporting layer as the injection is difficult due to a large energy difference between the work function of a metal material such as aluminum used in forming the negative electrode layer and the electron affinity (LUMO level) of the electron transporting layer. As materials for the electron injection layer from which the electron injection layer is formed, materials having low work function, for example fluorides or oxides of alkali metals such as lithium or cesium, or fluorides or oxides of alkali earth metals such as calcium, or alloys such as magnesium silver or lithium aluminum may be used.

For example, each of the organic layers provided between the electrode layers may have a thickness of 1-500 nm, the total thickness being 100-1000 nm.

Also, a sealing space formed by bonding the flexible film substrate of the organic EL illumination panel and the flexible film sealing material via a seal part may be preferably filled with a filler to inhibit contact between the flexible film sealing material and the electrode layers. As such filler, an inert gas or silicon containing a dewatering material may be used. Among organopolysiloxanes, high viscosity-liquid dimethylpolysiloxane is preferred. The dewatering material may include calcium oxide.

Figure 2:
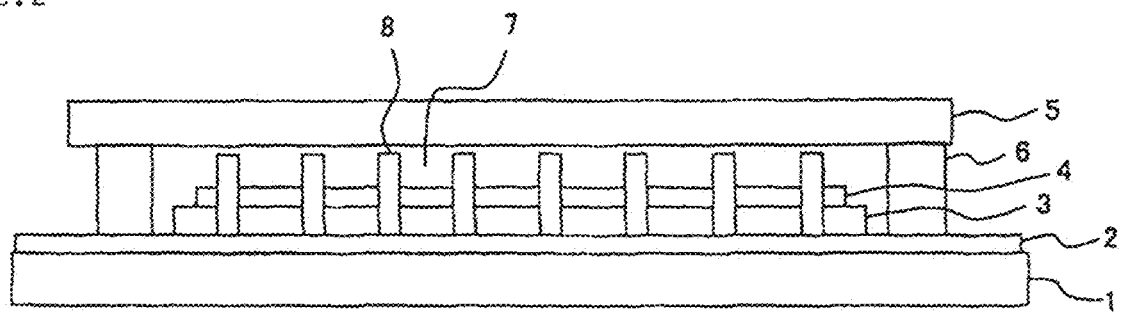
FIG. 2 is a view showing a cross-section along A-A' line in FIG. 1 of the organic EL illumination panel according to the present invention.
Figure 3:
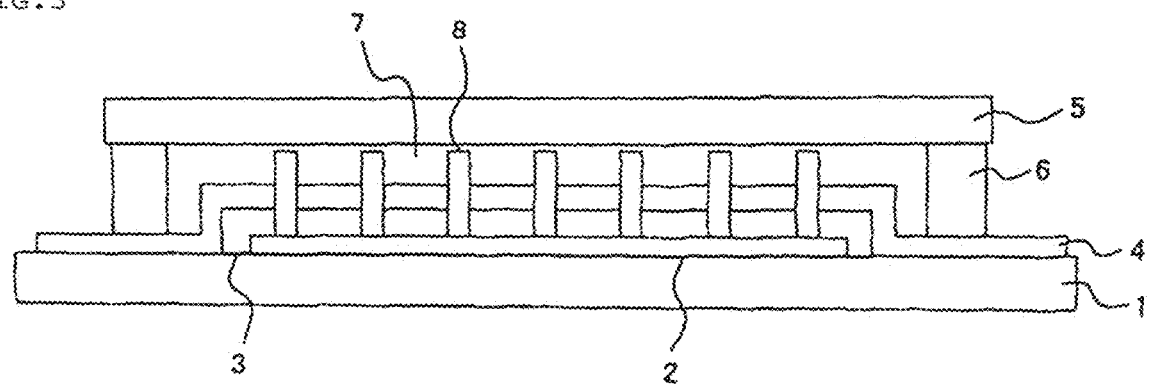
FIG. 3 is a view showing a cross-section along B-B' line in FIG. 1 of the organic EL illumination panel according to the present invention.

An example of the organic EL illumination panel is shown in FIG. 1 as a schematic view. FIG. 2 shows a cross-section along A-A' line of FIG. 1, and FIG. 3 shows a cross-section along B-B' line of FIG. 1. The organic EL illumination panel as shown in FIGS. 1-3 comprises a positive electrode (2) as the transparent electrode layer, an organic layer (3) and a negative electrode (4) as the electrode layer laminated sequentially on a flexible film substrate (1), a flexible film sealing material (5) being bonded to the flexible film substrate (1) via a seal part (6) to form a sealing space (7). Multiple spacers (8) pass through the organic layer and the electrode layers and are disposed on the transparent electrode layer such that distal ends of the spacers are placed above a top surface of the negative electrode as the electrode layer. In this figure, the distal ends of the spacers are not in contact with a sealing material, but may be preferably in contact with a sealing material in some cases.

An example of a method for manufacturing the organic EL illumination panel will be described.

The transparent electrode layer is formed on the transparent flexible film substrate. The transparent electrode may be formed by depositing a film of a material for the transparent electrode layer by sputtering, vapor deposition or CVD through a shadow mask, or patterning a light-transmitting electrode film uniformly formed from a material for the transparent electrode layer by photolithography. To form a connection part with a wiring member at one end of the transparent electrode layer, the one end may be preferably extended.

Spacers are formed on the transparent electrode layer laminated on the transparent flexible film substrate. Such spacers may be formed by depositing a film of a spacer material by sputtering, vapor deposition or the like and patterning by photolithography, or by sputtering, vapor deposition or the like through a shadow mask. Also, such spacers may be formed by a printing method such as dispense coating, inkjet coating, screen/flexo/gravure or the like.

When the spacers are formed by photolithography, after the electrode layer is formed, a photoresist film is formed on the electrode layer and the photoresist film is patterned by photolithography to form the spacers. Photo resists may be negative types or positive types, but a negative type photoresist such as acrylic resins, novolacs, polyimides or the like may be used, for example. By using photolithography, fine patterns in the order of 10 μm can be formed. Also, it is preferred that a transparent acrylic resin is used as the resist not to shield light from the organic EL.

When the spacers are formed by printing, the procedure may be repeated several time to obtain a desired height of the spacers. The spacers formed by printing have a size larger than by photolithography. Also, in case of printing, the height may be increased, a variety of materials may be selected, the manufacturing procedure may be simplified, simply apparatuses may be used, the production effectiveness may be enhanced, and production costs may be reduced. Such spacers may be formed in regions not only with the organic layer but without the organic layer laminated on the flexible film substrate.

Figure 4:
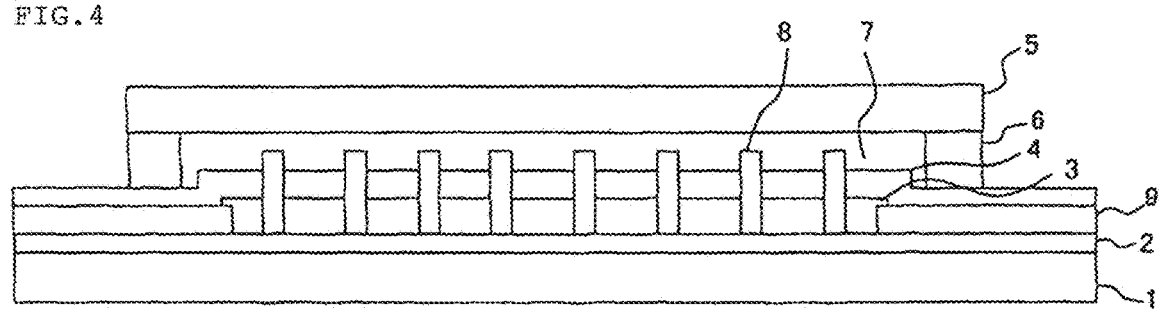
FIG. 4 is a cross-sectional view showing another example of an organic EL illumination panel according to the present invention.

Also, as shown in FIG. 4, when a photoresist film is patterned to form the spacers (8), an insulation part (9) may be formed in the periphery of the panel, serving as an electrode drawing part for the negative electrode. As a mask material used in pattering the photoresist film to form the spacers (8), a half tone mask or gray tone mask may be used, so that the insulation part can have a height different from the spacers. The insulation part (9) allows manufacturing various light-emitting types of organic EL illumination panels. Also, a pattering process of the transparent electrode layer may be omitted as long as the underlying transparent electrode layer is uniformly formed.

Then, the organic layer is formed. The electron injection layer, the electron transporting layer, the light-emitting layer, the hole transporting layer, the hole injection layer, and the hole blocking layer may be formed using the foregoing materials as a desired shape by a vapor deposition method with resistance heating, a MBE method or a laser ablation method through a shadow mask. Also, if a polymer material is used in forming these layers, each layer may be formed as a desired shape by an inkjet method using a solution of the polymer material, or alternatively each layer may be formed as a desired shape by spin coating or slit coating a photosensitive coating solution followed by photolithography.

The other electrode layer mated with the transparent electrode layer may be formed by a method such as vapor deposition or sputtering on the organic layer. To form a connection part with a wire member at one end of the electrode layer, the one end may be preferably extended.

Then, the flexible film sealing material is bonded or welded to the flexible film substrate on which the organic layer and the electrode layers are formed through a seal part, and the organic layer and the electrode layers are sealed within a sealing space. As the seal part, an UV-curable or heat-curable adhesive including epoxy resins or acrylic resins may be used. A bonded surface of the flexible film substrate and the flexible sealing material is subjected to a surface treatment such as local plasma treatment under normal pressure or coupling treatment to increase the adhesion of the seal part. Alternatively, a laminate method may be applied. At this time, the procedure is performed under an inert gas such as nitrogen and also an inert gas is filled in the sealing space, thereby obtaining the organic EL illumination panel.

Also, after the organic layer and the electrode layer are sealed, silicon containing a collector such as calcium oxide may be filled in a sealing space. As a result, constant inner pressure is maintained, and contact between the electrode layer or the organic layer and the sealing material is suppressed by a synergic effect with spacers, so that defects in the electrode layers or the organic layer can be suppressed even when the organic EL illumination panel is bent.

Figure 5:
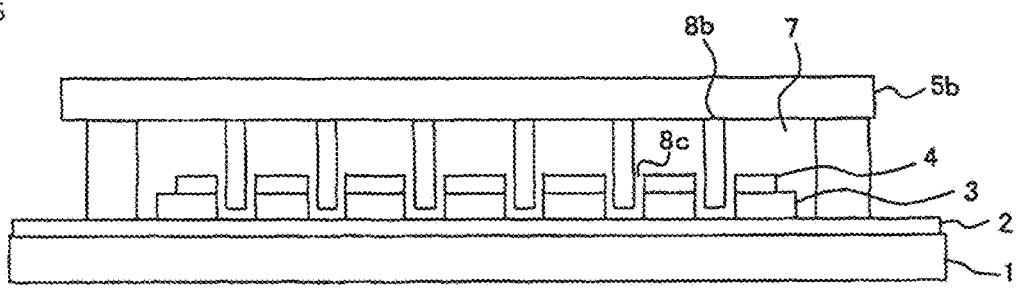
FIG. 5 is a cross-sectional view showing another example of an organic EL illumination panel according to the present invention.

Also, the organic EL illumination panel according to the present invention may have spacers provided to be opposed to the electrode layer which is laminated on the organic layer on the flexible film sealing material and above the organic layer. As shown in the cross-sectional view of FIG. 5, spacers are provided on the flexible film sealing material (5b). In this figure, the same reference numbers as in FIG. 1 denotes the same members as the members of the organic EL illumination panel shown in FIG. 1, respectively. The spacers (8b) provided on the flexible film sealing material (5b) may have the same shape, material, density and area occupied in the organic layer as the spacers (8) of the organic EL illumination device shown in FIG. 1. Holes (8c) for inserting the spacers (8b) are provided in regions opposed to the spacers (8b) on the electrode layer (4) and the organic layer (3), the spacers being inserted until reaching the transparent electrode (2).

The spacers (8b) formed on the flexible film sealing material may have a height to allow their distal ends to contact with the transparent electrode layer (2), but it is preferred to have a height to maintain contactless in view of an interval variation of the substrate when bending. Specifically, the height is preferably from 50 µm to 500 µm, depending on a height of the sealing space.

Such spacers (8b) may be formed on the flexible film sealing material using the same method as the spacers (8). To form the holes (8c) for inserting the spacers (8b) provided in the electrode layer (4) and the organic layer (3), the organic layer and the electrode layer may be formed using a shadow mask not to form a layer at the holes.

Figure 6:
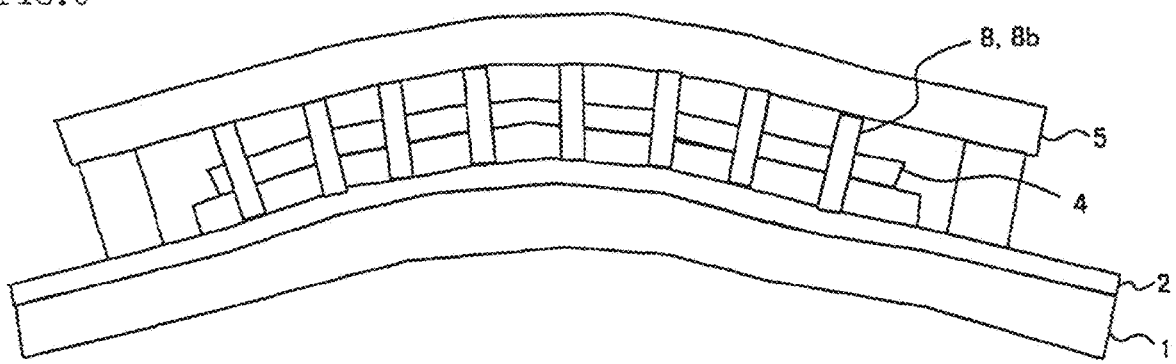
FIG. 6 is a view showing an operation mode for an example of an organic EL illumination panel according to the present invention.
Figure 7:
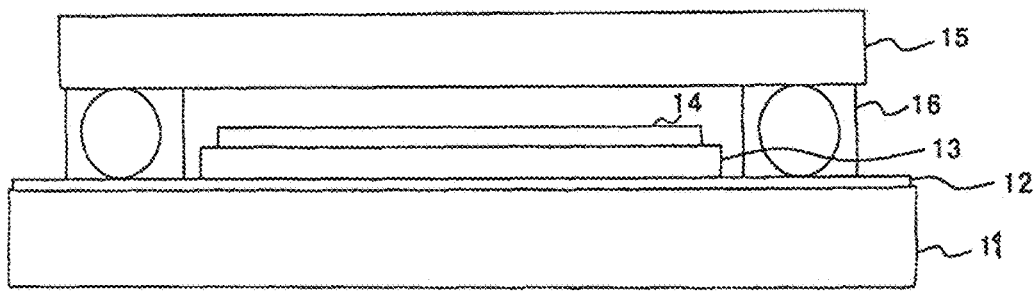
FIG. 7 is a cross-sectional view showing a conventional organic EL illumination panel.
Figure 8:
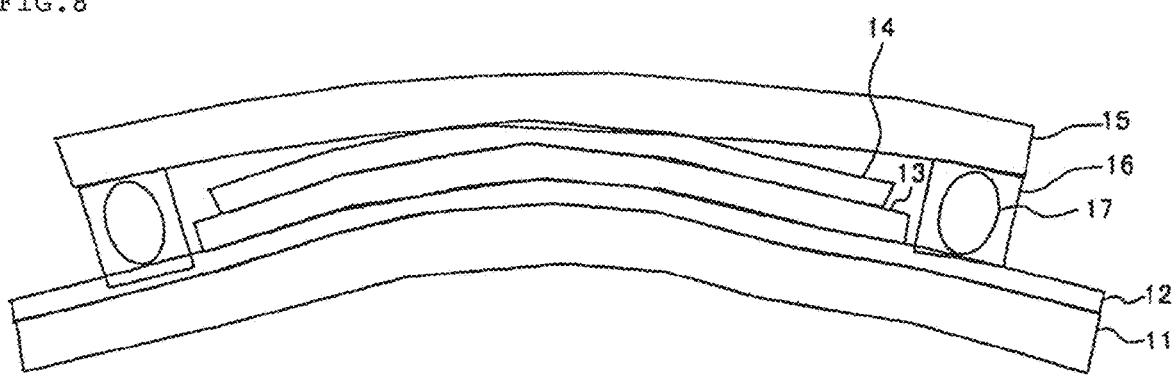
FIG. 8 is a view showing an operation mode for a conventional organic EL illumination panel.

As shown in FIG. 6, the organic EL illumination panel can maintain an interval between the electrode layer (4) and the flexible film sealing material (5) by the spacers (8, 8b), and can suppress contact between the electrode layer and the flexible film sealing material. As a result, defects in the electrode layer or the organic layer can be suppressed.

Also, for an organic EL illumination device in which the organic EL element is applied, a lighting circuit, a control circuit for the lighting circuit and the like are provided, these circuits being connected via wiring connected to a connection part formed by extending one end of each of the transparent electrode layer and the mated electrode layer of the organic EL element. An external power supply may be provided for the transparent electrode layer and the electrode layer therethrough. The wiring having a width over the entire width of one end of the electrodes may be used to suppress an increase in resistance of the connection part. As the wiring, a flexible film such as copper polyimide may bee used. Such an organic EL illumination devices may be applied to a backlight for a liquid crystal display or the like.

EXAMPLES

Hereinafter, the lithium ion secondary batter according to the present invention will be described in detail.

Example 1

A transparent conductive film of indium tin oxide (ITO) was formed and patterned on a polyethylene naphthalate-based film having 200 µm thickness by sputtering through a shadow mask to form a transparent electrode layer. A negative type light sensitive acrylic resin solution as a photoresist was coated on the transparent electrode layer followed by heating. Then, spacers having diameter 15 µm and height 5 µm were formed on the transparent electrode layer at the density of 100 spacers/cm$^2$. Then, using Cu-Pc (copper phthalocyanine) as a hole injection material, α-NPD (N,N'-diphenyl-N—N-bis(1-naphthyl)-1,1'-biphenyl)-4,4'-diamine) as a hole transporting material, CBP (4,4'-biscarbazolylbiphenyl) having doped Ir(ppy)$_3$ (tris-(2-phenylpyridine)iridium complex), Btp$_2$Ir(acac) (bis(2-(2'-benzo(4,5-α) thienyl)pyridinate-N,C2')(acetylacetonate) iridium complex) and further CBP having doped FIr(pic)

(bis(4,6-di-fluorophenyl)-pyridinate-N,C2')picolinate iridium complex) as a light-emitting material, BCP (2,9-dimethyl-4,7-diphenyl-1,10-phenanthroline) as a hole blocking layer, Alq3 as an electron transporting layer, and LiF as an electron injection material, these materials were sequentially deposited by vapor (heating) deposition through a mask to form an organic layer. A negative electrode was formed by vapor (heating) deposition of aluminum on the organic layer. A thickness of the resulting organic EL element part which comprised the electrode layers and the organic layer sandwiched there between was 285 nm as the sum of the organic layer and the negative electrode layer. The spacers were protruded 4.7 μm from a top surface of the negative electrode. Then, a film having 100 μm thickness made of the same material as the flexible film substrate was bonded to the flexible film substrate on which the organic EL element part using an epoxy adhesive under nitrogen atmosphere to make an organic EL illumination panel. At this time, plasma surface treatment under normal pressure was performed on a bonded area of the surface of the flexible film substrate was performed to increase adhesion.

When lighting was performed at the constant current of 25 A/m$^2$ as a driving current, driving voltage was 4.6V and brightness was 980 cd/m$^2$.

[Vibration Test]

The organic EL illumination panel was fixed to a fixing jig and a load of vibration frequency 5-100 Hz and acceleration 30 G was applied in each of x, y and z directions for 1 minute. This action was repeated 10 times. Then, the lighting of the panel was performed. All panels of tested 10 panels were lighted.

[Impact Test]

The organic EL illumination panel was fixed to a fixing jig and a load of acceleration 30 G was applied in each of x, y and z directions for 10 msec. This action was repeated 3 times. Then, the lighting of the panel was performed. All panels of tested 10 panels were lighted.

[Bending Test]

Each of left and right sides against a center of the organic EL illumination panel was bent by 60 degrees and this action was repeated 30 times. Then, the lighting of the panel was performed. All panels of tested 10 panels were lighted.

Comparative Example

An organic EL illumination panel was manufactured using the same method as in Example 1 except for providing no spacer, and tests were performed on the resulting product. In the vibration test, 8 panels of tested 10 panels were not lighted. In the impact test, none panels of tested 10 panels were not lighted. In the bending test, 9 panels of tested 10 panels were not lighted.

From these results, it was demonstrated that the organic EL illumination panel with no spacer exhibited short or leak, while the organic EL illumination panel of the present invention suppressed the occurrence of defects in the organic layer or the electrode layer under bending, vibration or impact.

The present application incorporates herein by reference Patent Application No. 2012-079905 filed on Mar. 30, 2012 in its entirety.

THE DESCRIPTION OF REFERENCE NUMBERS

1 flexible film substrate
2 transparent electrode layer
3 organic layer
4 electrode layer
5, 5b flexible film sealing material
8, 8b spacer

INDUSTRIAL APPLICABILITY

The present invention is applicable to all of industrial fields requiring a surface light source, and more particularly to a surface light source for various illumination devices, as well as a surface light source for various display devices, and display devices of personal computers or terminals such as cellular phones or multifunctional cellular phones.

The invention claimed is:

1. A method for manufacturing an organic electroluminescent illumination panel comprising a pair of first and second electrode layers, at least one of which is transparent, the pair of the first and second electrode layers being positioned between a flexible film substrate and a flexible film sealing material, at least one of the flexible film substrate and the flexible film sealing material being on a same side as a transparent electrode layer of the first and second electrode layers, at least one of the flexible film substrate and the flexible film sealing material being transparent, the organic electroluminescent illumination panel further comprising an organic layer containing an organic electroluminescence, the organic layer being sandwiched between the first and second electrode layers, the method comprising:
   laminating the first electrode layer on the flexible film substrate, the first electrode layer extending to front and back end surfaces of the flexible film substrate to form a first connection part with a wiring member;
   forming a photoresist film on the first electrode layer;
   patterning the photoresist film by photolithography to form spacers having a cylindrical shape so as to have a height to pass through the organic layer and the second electrode layer with distal ends thereof being protruded from the second electrode layer;
   laminating the organic layer and the second electrode layer in this order on the first electrode layer so that the second electrode layer is formed on the flexible film substrate, wherein the second electrode layer is extended to the both end surfaces of the flexible film substrate to form a second connection part with a wiring member; and
   providing the flexible film sealing material via a seal part formed at front and back end portions of the first electrode layer and at two side end portions of the second electrode layer which are formed on the flexible film substrate so that the flexible film sealing material is not in contact with the distal ends of the spacers, and that the seal part exists inside of the first and second connection parts.

2. A method for manufacturing an organic electroluminescent illumination panel comprising a pair of first and second electrode layers, at least one of which is transparent, the pair of the first and second electrode layers being positioned between a flexible film substrate and a flexible film sealing material, at least one of the flexible film substrate and the flexible film sealing material being on a same side as a transparent electrode layer of the first and second electrode layers, at least one of the flexible film substrate and the flexible film sealing material being transparent, the organic electroluminescent illumination panel further comprising an organic layer containing an organic electroluminescence, the organic layer being sandwiched between the first and second electrode layers, the method comprising:
  laminating the first electrode layer on the flexible film substrate, the first electrode layer extending to front and back surfaces of the flexible film substrate to form a first connection part with a wiring member;
  applying a spacer material on the first electrode layer by dispense coating, inkjet coating, or screen-, flexo-, or gravure-printing to form spacers having a cylindrical shape so as to have a height to pass through the organic layer and the second electrode layer with distal ends thereof being protruded from the second electrode layer;
  laminating the organic layer and the second electrode layer in this order on the first electrode layer so that the second electrode layer is formed on the flexible film substrate, wherein the second electrode layer is extended to the both end surfaces of the flexible film substrate to form a second connection part with a wiring member; and
  providing the flexible film sealing material via a seal part formed at front and back end portions of the first electrode layer and at two side end portions of the second electrode layer which are formed on the flexible film substrate so that the flexible film sealing material is not in contact with the distal ends of the spacers, and that the seal part exists inside of the first and second connection parts.

3. An organic electroluminescent illumination panel comprising:
  a pair of first and second electrode layers, at least one of which is transparent, the pair of the first and second electrode layers being positioned between a flexible film substrate and a flexible film sealing material, at least one of the flexible film substrate and the flexible film sealing material being on a same side as a transparent electrode layer of the first and second electrode layers, at least one of the flexible film substrate and the flexible film sealing material being transparent, the organic electroluminescent illumination panel further comprising an organic layer containing an organic electroluminescence, the organic layer being sandwiched between the first and second electrode layers,
  wherein the first electrode layer is disposed on the flexible film substrate, and is extended to front and back surfaces of the flexible film substrate, and is a first connection part with a wiring member;
  wherein the organic electroluminescent illumination panel further comprises multiple spacers having a cylindrical shape fixed on the first electrode layer so as to pass through the organic layer and the second electrode layer, each of the multiple spacers having an unattached end that is free to move, and a seal part formed on front and back end portions of the first electrode layer and two side portions of the second electrode layer which are formed on the flexible film substrate so that the flexible film sealing material is not in contact with respective distal ends of the multiple spacers, and that the seal part exists inside of the first and the second connection parts;
  wherein the organic layer and the second electrode layer are laminated in this order on the first electrode layer so that the second electrode layer is formed on the flexible film substrate extended to two side end surfaces of the flexible film substrate, and the two side end surfaces being a second connection part with a wiring member.

4. An organic electroluminescent illumination device using the organic electroluminescent illumination panel according to claim 3.

5. The method for manufacturing the organic electroluminescent illumination panel according to claim 1, wherein the first electrode layer and the flexible film substrate are transparent, and
  the thickness of the flexible film substrate is 20 to 300 µm, the thickness of the flexible film sealing material is 50 to 200 µm, and a transmission rate of at least one of the flexible film substrate and the flexible film sealing material of light emitting from the organic electroluminescence is 80% or more transmission based on a total light amount.

6. The method for manufacturing the organic electroluminescent illumination panel according to claim 1, wherein the flexible film substrate and the flexible film sealing material comprise a resin film, and the resin film comprises at least one selected from the group consisting of polyethylene naphthalate (PEN), polyethylene terephthalate (PET), polymethyl methacrylate, polyethyl methacrylate, polymethyl acrylate, polyethyl acrylate, polyethylsulfone (PES), and polycarbonate (PC).

7. The method for manufacturing the organic electroluminescent illumination panel according to claim 1, wherein at least one of the flexible film substrate and the flexible film sealing material comprises a resin film and a gas barrier layer configured to suppress permeation of gases.

8. The method for manufacturing the organic electroluminescent illumination panel according to claim 1, wherein the organic layer has a thickness of 100 nm to 1000 nm.

9. The method for manufacturing the organic electroluminescent illumination panel according to claim 2, wherein the first electrode layer and the flexible film substrate are transparent and the thickness of the flexible film substrate is 20 to 300 µm, the thickness of the flexible film sealing material is 50 to 200 µm, and a transmission rate of at least one of the flexible film substrate and the flexible film sealing material of light emitting from the organic electroluminescence is 80% or more transmission based on a total light amount.

10. The method for manufacturing the organic electroluminescent illumination panel according to claim 2, wherein the flexible film substrate and the flexible film sealing material comprise a resin film, and the resin film comprises at least one selected from the group consisting of polyethylene naphthalate (PEN), polyethylene terephthalate (PET), polymethyl methacrylate, polyethyl methacrylate, polymethyl acrylate, polyethyl acrylate, polyethylsulfone (PES), and polycarbonate (PC).

11. The method for manufacturing the organic electroluminescent illumination panel according to claim 2, wherein at least one of the flexible film substrate and the flexible film sealing material comprises a resin film and a gas barrier layer configured to suppress permeation of gases.

12. The method for manufacturing the organic electroluminescent illumination panel according to claim 2, wherein the organic layer has a thickness of 100 nm to 1000 nm.

13. The organic electroluminescent illumination panel according to claim 3, wherein the thickness of the flexible film substrate is 20 to 300 µm, the thickness of the flexible film sealing material is 50 to 200 µm, and a transmission rate of at least one of the flexible film substrate and the flexible film sealing material of light emitting from the organic electroluminescence is 80% or more transmission based on a total light amount.

14. The organic electroluminescent illumination panel according to claim 3, wherein an average cross-sectional area occupied by one spacer, of the multiple spacers, in a cross-section parallel to a surface direction of the organic layer corresponds to an area of a circle having a diameter of 5 µm to 50 µm inclusive.

15. The organic electroluminescent illumination panel according to claim 3, wherein the multiple spacers in a cross-section parallel to a surface direction of the organic layer are present in a density from 100 spacers/cm$^2$ to 400 spacers/cm$^2$ inclusive.

16. The organic electroluminescent illumination panel according to claim 3, wherein an inert gas or silicone containing a dewatering material is filled in a gap between the flexible film substrate and the flexible film sealing material.

17. The organic electroluminescent illumination panel according to claim 3, wherein the flexible film substrate and the flexible film sealing material comprise a resin film, and the resin film comprises at least one selected from the group consisting of polyethylene naphthalate (PEN), polyethylene terephthalate (PET), polymethyl methacrylate, polyethyl methacrylate, polymethyl acrylate, polyethyl acrylate, polyethylsulfone (PES), and polycarbonate (PC).

18. The organic electroluminescent illumination panel according to claim 3, wherein at least one of the flexible film substrate and the flexible film sealing material comprises a resin film and a gas barrier layer configured to suppress permeation of gases.

19. The organic electroluminescent illumination panel according to claim 3, wherein the organic layer has a thickness of 100 nm to 1000 nm.

\* \* \* \* \*